(12) United States Patent
Fritz et al.

(10) Patent No.: US 12,370,649 B2
(45) Date of Patent: Jul. 29, 2025

(54) ABRASIVE ELEMENTS WITH PRECISELY SHAPED FEATURES, ABRASIVE ARTICLES FABRICATED THEREFROM AND METHODS OF MAKING THEREOF

(71) Applicant: 3M INNOVATIVE PROPERTIES COMPANY, St. Paul, MN (US)

(72) Inventors: Matthew C. Fritz, Woodbury, MN (US); Junqing Xie, Woodbury, MN (US); Vincent J. Laraia, Houlton, WI (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 1021 days.

(21) Appl. No.: 17/430,774

(22) PCT Filed: Feb. 11, 2020

(86) PCT No.: PCT/IB2020/051078
§ 371 (c)(1),
(2) Date: Aug. 13, 2021

(87) PCT Pub. No.: WO2020/165759
PCT Pub. Date: Aug. 20, 2020

(65) Prior Publication Data
US 2022/0134512 A1    May 5, 2022

Related U.S. Application Data

(60) Provisional application No. 62/805,003, filed on Feb. 13, 2019.

(51) Int. Cl.
*B24D 11/00* (2006.01)
*B24B 53/017* (2012.01)
*H01L 21/306* (2006.01)

(52) U.S. Cl.
CPC ............ *B24D 11/00* (2013.01); *B24B 53/017* (2013.01); *H01L 21/30625* (2013.01)

(58) Field of Classification Search
CPC ..... B24B 37/245; B24B 37/20; B24B 53/017; B24D 11/001
(Continued)

(56) References Cited

U.S. PATENT DOCUMENTS

| 5,152,917 A | 10/1992 | Pieper |
| 5,435,816 A | 7/1995 | Spurgeon |

(Continued)

FOREIGN PATENT DOCUMENTS

| EP | 2684211 B1 | 1/2017 |
| JP | 2003175465 A | 6/2003 |

(Continued)

OTHER PUBLICATIONS

EP Application 20755385, Supplementary European Search Report dated Sep. 27, 2022, 3 pages.

(Continued)

*Primary Examiner* — Robert F Neibaur
(74) *Attorney, Agent, or Firm* — Jonathan L. Tolstedt

(57) ABSTRACT

An abrasive article includes a plurality of abrasive features disposed on one or more abrasive elements. Each of the one or more abrasive elements includes a base having a first major surface from which the plurality of abrasive features extends. A first set of the plurality of abrasive features (i) has an average height, $H_{1avg}$, (ii) a standard deviation of less than 10% of $H_{1avg}$, and (iii) comprises between 5 and 130 abrasive features.

13 Claims, 4 Drawing Sheets

(58) Field of Classification Search
USPC .................................. 451/41, 287, 56, 443
See application file for complete search history.

(56) References Cited

U.S. PATENT DOCUMENTS

| | | | |
|---|---|---|---|
| 6,021,559 | A | 2/2000 | Smith |
| 6,076,248 | A | 6/2000 | Hoopman |
| 6,224,465 | B1 * | 5/2001 | Meyer ..................... B24B 37/24 |
| | | | 977/734 |
| 6,818,029 | B2 | 11/2004 | Myoung |
| 9,956,664 | B2 | 5/2018 | Lehuu |
| 2005/0032462 | A1 | 2/2005 | Gagliardi |
| 2010/0003904 | A1 | 1/2010 | Duescher |
| 2010/0255254 | A1 | 10/2010 | Culler et al. |
| 2014/0113532 | A1 | 4/2014 | Smith |
| 2015/0224625 | A1 * | 8/2015 | Lehuu ..................... B24D 3/18 |
| | | | 451/442 |
| 2015/0283672 | A1 | 10/2015 | Chou et al. |
| 2017/0095903 | A1 | 4/2017 | Galpin |

FOREIGN PATENT DOCUMENTS

| | | |
|---|---|---|
| WO | WO 2014-022462 | 2/2014 |
| WO | WO 2014-022465 | 2/2014 |

OTHER PUBLICATIONS

International Search report for PCT International Application No. PCT/IB2020/051078 mailed on Jun. 15, 2020, 2 pages.

* cited by examiner

ABRASIVE ELEMENTS WITH PRECISELY SHAPED FEATURES, ABRASIVE ARTICLES FABRICATED THEREFROM AND METHODS OF MAKING THEREOF

CROSS REFERENCE TO RELATED APPLICATIONS

This application is a national stage filing under 35 U.S.C. 371 of PCT/IB2020/051078, filed 11 Feb. 2020, which claims the benefit of Provisional Application No. 62/805,003, filed 13 Feb. 2019, the disclosure of which is incorporated by reference in their entirety herein.

TECHNICAL FIELD

The present disclosure relates generally to abrasives and abrasive articles.

BACKGROUND

Various abrasive articles are described in, for example, U.S. Pat. No. 9,956,664 and PCT Intl. Pubs. WO 2014/022462 and WO 2014/022465.

SUMMARY

In some embodiments, an abrasive article is provided. The abrasive article includes a plurality of abrasive features disposed on one or more abrasive elements. Each of the one or more abrasive elements includes a base having a first major surface from which the plurality of abrasive features extends. A first set of the plurality of abrasive features (i) has an average height, $H_{1avg}$, (ii) a standard deviation of less than 10% of $H_{1avg}$, and (iii) comprises between 5 and 130 abrasive features.

In some embodiments, a method of conditioning a polishing pad is provided. The method include performing a CMP operation using a polishing pad and then contacting a working surface of the polishing pad with a working surface of the above-described abrasive article.

Figure 1A:
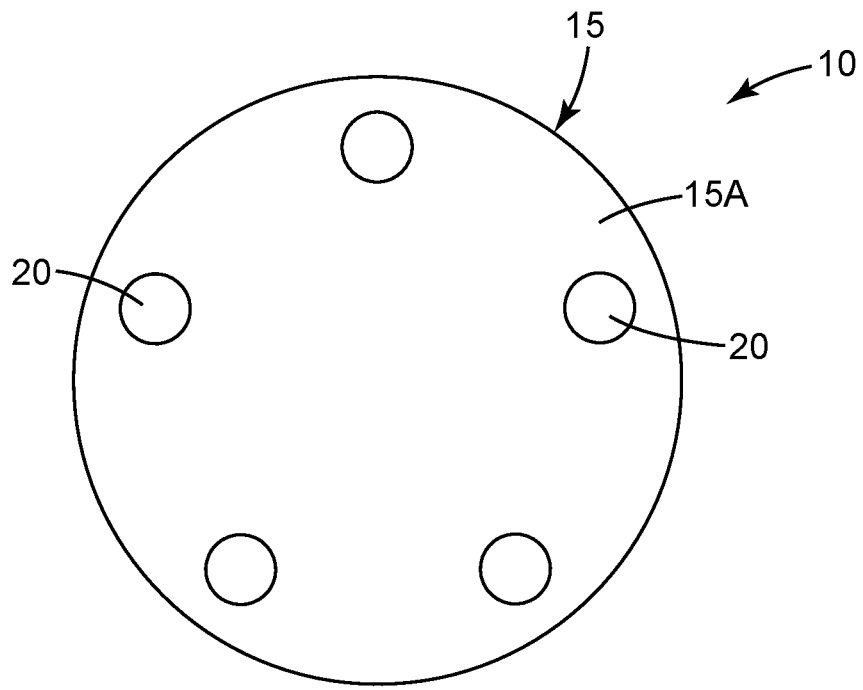
FIG. 1A is a schematic top view of an abrasive article according to some embodiments of the present disclosure.
Figure 1B:
FIG. 1B is a schematic side view of the abrasive article of FIG. 1A.

These figures are not drawn to scale and are intended merely for illustrative purposes.

DETAILED DESCRIPTION

The semiconductor and microchip industries rely on a number of chemical-mechanical planarization (CMP) processes during device manufacturing. These CMP processes are used to planarize the surface of a wafer in the fabrication of integrated circuits. Typically, they utilize an abrasive slurry and polishing pad. During the CMP process, materials are removed from the wafer and the polishing pad, and byproducts are formed. These can accumulate on the polishing pad surface, glazing its surface and degrading its performance, decreasing its lifetime, and increasing wafer defectivity. To address these issues, pad conditioners are designed to regenerate the polishing pad performance through an abrading mechanism which removes the undesirable waste accumulations and recreates asperities on the polishing pad surface.

Pad conditioners for CMP often include an abrasive element or multiple abrasive elements affixed to a carrier. Different carriers are engineered for convenient attachment to the different configurations of CMP equipment. Some types of abrasive elements used for CMP pad conditioners utilize CVD diamond films deposited on suitable substrates. The substrates are often formed or machined to exhibit macro- or micro-structural features. Microreplication is utilized for example in 3M TRIZACT B6-1900-552 and B75-2990-552 pad conditioners. These conditioners include abrasive elements that present arrays of pyramidal features coated with CVD diamond film to the pad being conditioned in the CMP process. Depending on the details of a design, it is possible to provide for features that are essentially coplanar at different discrete levels, e.g., a tallest primary level, a secondary level, tertiary level, etc. The areal densities and height differences of primary, secondary and lower level features are among the design parameters that affect the pad wear rate, pad texture and conditioner life for a particular CMP process.

As the nature of CMP polishing pads shifts towards very soft and easily conditioned polishing pads in some applications, and very hard and not easily conditioned polishing pads in other applications, it has become increasingly important to be able to decouple the surface texture a pad conditioner generates from the polishing pad wear rate it generates. Two opposite scenarios can be envisioned from which it is difficult to create a high performing pad conditioner. In a first scenario, a very hard polishing pad may be used for high planarization and high removal rate. In such a scenario, the polishing pad may require a highly aggressive pad conditioner that will maintain a shallow surface texture for a very high oxide removal rate with a ceria slurry. In a second scenario, a very soft polishing pad may be used for defectivity reduction in advanced node applications. In this scenario, the polishing pad may require a low aggressiveness pad conditioner that will maintain a higher surface texture in order to extend the polishing pad lifetimes of very soft pads that need to maintain a higher removal rates when using silica slurries.

For most conventional diamond grit and CVD coated conditioners, it is known that there is some correlation between the areal spacing of the diamonds or abrasive features and the surface roughness that they generate on a given CMP pad (as the tip density decreases both the pad wear rate and surface finish increase). The density of primary features in microreplicated pad conditioners can have a wide range, with commercial products varying from about 100-3300 primary features on a typical abrasive element having a diameter of about 11-12 mm. For most conventional pad conditioners, the pad wear rate must be high in order to maintain high surface roughness. This can become a cost of ownership issue when soft and easily conditioned pads are used. However, it has been discovered that abrasive articles with primary feature areal densities as low as 0.008/$mm^2$ (e.g., 1 primary feature per element having a diameter of about 11-12 mm) provide low pad wear rate while maintaining high surface roughness. Moreover, such pad conditioners generate less debris in the bin size ranging from 1 to 10 microns and reduce defects in CMP applications.

Generally, in some embodiments, the present disclosure is directed to abrasive articles useful for conditioning polishing pads employed in CMP processes, in which the areal density of primary abrasive features as well the height offset between primary abrasive features and secondary abrasive features (and any next level abrasive features) allows for both the polishing pad wear rate and the polishing pad surface finish to be controlled independently. In the abrasive articles of the present disclosure, polishing pad wear rate correlates positively with the number of primary abrasive features and this behavior is contrary to a negative relationship between pad wear rate and the number of primary abrasive features for conventional micro-replicated pad conditioners. Moreover, in the abrasive articles of the present disclosure, the pad wear rate does not hold bearing over the surface roughness of the polishing pad, which may be controlled separately by the abrasive feature offset height. For example, in use of some embodiments of the abrasive articles of the present disclosure, only a small number of primary abrasive features will engage the working surface of the polishing pad and form grooves or scratches in the working surface as they remove relatively large quantities of polishing pad material, while a large number of secondary abrasive features can make contact with the working surface of the polishing pad as well. The secondary abrasive features are expected to achieve less material removal than the primary abrasive features, and act mainly as a depth of penetration stop layer for the primary abrasive features. This enables the material removal and surface finishing properties of the conditioner to be varied independently, e.g., by varying the vertical/height offset of the primary abrasive features to modulate surface roughness and the number of primary abrasive features to modulate the pad wear rate. Moreover, as a consequence of depth of penetration control the sensitivity of polishing pad cut rate and surface roughness to pad conditioner downforce may also be reduced. These aspects of the abrasive articles of the present disclosure are in contrast to known abrasive articles with higher densities of primary abrasive features, for which the primary abrasive feature count will correlate inversely to both the polishing pad wear rate and mean surface roughness of the polishing pad. Still further, compared to conventional micro-replicated pad conditioners, the abrasive articles of the present disclosure offer a slower pad wear rate decay over their lifetime, which enables more consistent CMP performance.

Figure 2A:
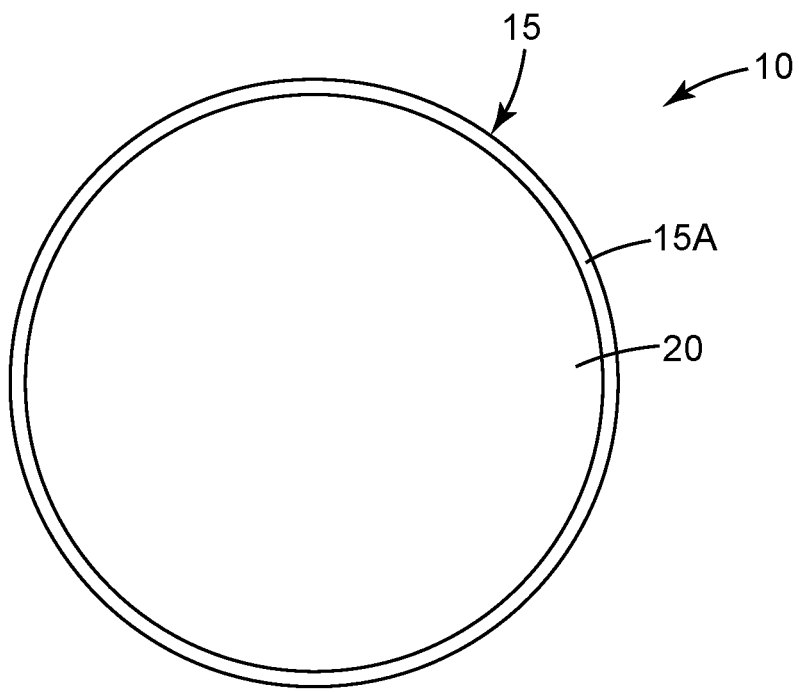
FIG. 2A is a schematic top view of an abrasive article according to some embodiments of the present disclosure.
Figure 2B:
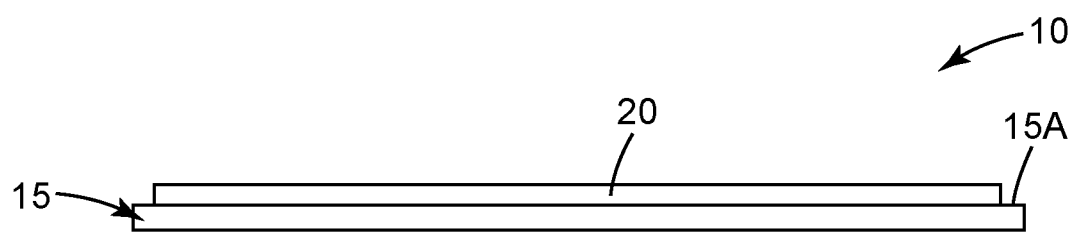
FIG. 2B is a schematic side view of the abrasive article of FIG. 2A.

In some embodiments, with reference to FIGS. 1A-1B and 2A-2B, the present disclosure is directed to an abrasive article 10 (which may be considered a pad for conditioning polishing pads used in CMP processes, or a pad conditioner) that includes a carrier element 15 and one or more abrasive elements 20 disposed on a major surface 15A of the carrier element 15 (the side of the abrasive article 10 having the one or more abrasive elements 20 may be considered a working surface of the abrasive article 10). As shown, the abrasive article may have a plurality of abrasive elements 20 (FIGS. 1A-1B) or a single abrasive element 20 (FIGS. 2A-2B). In some embodiments, the major surface 15A of the carrier element may be planar or substantially planar. In some embodiments, suitable materials for the carrier element 15 may include metals (e.g., stainless steel), ceramic, polymers (e.g., polycarbonate), cermet, silicon, and composites. The carrier element may have any shape, such as circular (shown in FIG. 1). Alternatively, for example, the carrier element 15 may be non-circular or the shape of an annulus.

Figure 3A:
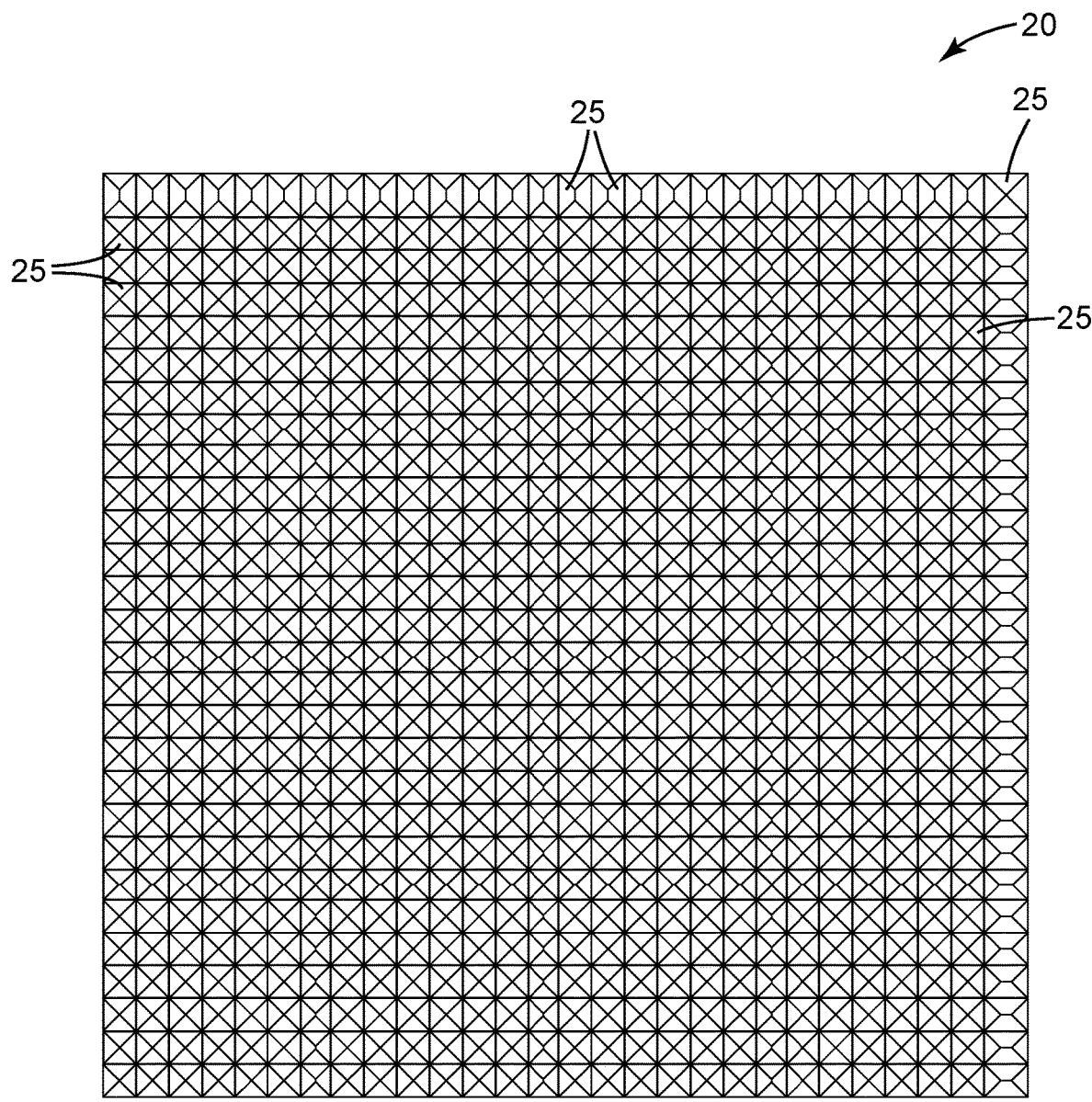
FIG. 3A is a schematic top view of an abrasive element according to some embodiments of the present disclosure.
Figure 3B:
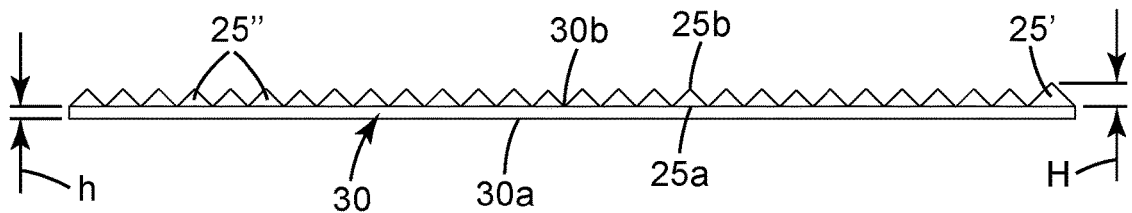
FIG. 3B is a schematic side view of the abrasive element of FIG. 3A.

Referring now to FIGS. 3A-3B, in some embodiments, the abrasive elements 20 of the present disclosure may include a plurality of abrasive features 25 that each extend from a base 30. In some embodiments, the base 30 may extend between a first major surface 30a and a second major surface 30b, having a height (h) (or distance between major surfaces) of from 1 to 6 mm, from 2 to 4 mm, or from 3 to 3.5 mm. In some embodiments, the base 30 may have a uniform or substantially uniform height (h) throughout the abrasive element 20 (i.e., the height (h) may vary by no more than 200 microns, no more than 100 microns, no more than 20 microns, no more than 10 microns or no more than 1 micron). In some embodiments, the abrasive elements 20 may have a size, in terms of a projected area or footprint of a major surface, of from 30 to 9200 mm$^2$, from 30 to 2100 mm$^2$, or from 30 to 120 mm$^2$. As used herein, the term "projected area" of a surface refers to the area of a surface viewed in a direction normal to the surface taking into account only the perimeter dimensions of the surface (and not taking into account any surface contours (e.g., pores, asperities, projections, and the like)).

As shown in FIG. 3B, in some embodiments, each of the abrasive features 25 may extend from the second major surface 30b of the base 30. As used herein, an "abrasive feature" refers to a single body that (i) extends from a single feature base and terminates in a single feature maximum in the form of a point, a line, or a facet; and (ii) has a Mohs hardness of greater than 7, 8, 8.5, or 9. In some embodiments, each of the abrasive features 25 may have a feature height (H), which is defined as the distance between the feature maximum (e.g., feature maximum 25b) and the feature base (e.g., feature base 25a) measured in a direction normal to the second major surface 30b.

In embodiments in which the abrasive articles 10 include two or more abrasive elements 20, it is to be appreciated that each of the abrasive elements 20 may be the same or may be different from any one or more of the other abrasive elements 20 (in terms of shape, size, quantity of abrasive features, type of abrasive features, size of abrasive features, shape of abrasive features, and/or the like).

In some embodiments, the one or more abrasive elements 20 of the abrasive article 10, viewed as a collective, may include a first set of the abrasive features 25 (or primary abrasive features) that have an average feature height of $H_{1avg}$ and a standard deviation of less than 10% of $H_{1avg}$; optionally a second set of features (or secondary abrasive features) that have an average feature height of $H_{2avg}$ and a standard deviation of less than 10% of $H_{2avg}$, where $H_{1avg} > H_{2avg}$; optionally a third set of features (or tertiary abrasive features) that have an average feature height of $H_{3avg}$ and a standard deviation of less than 10% of $H_{3avg}$, where $H_{1avg} > H_{2avg} > H_{3avg}$; and so on. In some embodiments, $H_{1avg}$ is at least 5 microns, at least 10 microns, at least 20 microns, at least 50 microns, or at least 100 microns greater than $H_{2avg}$. In some embodiments, $H_{2avg}$ is at least 5 microns, at least 10 microns, or at least 20 microns greater than $H_{3avg}$. With respect to the embodiment illustrated in FIGS. 3A-3B, in terms of primary and secondary abrasive features, the abrasive element 20 includes a single primary abrasive feature 25' and a plurality of secondary abrasive features 25".

In some embodiments, the abrasive elements 20 of the abrasive article 10, collectively, may include from 5 to 130, from 5 to 100, or from 5 to 50 primary abrasive features; from 20 to 4500, from 200 to 4500, or from 2500 to 3500 secondary abrasive features; and from 20 to 1500, from 100 to 1500, or from 900 to 1200 tertiary abrasive features. It is to be appreciated that the primary, secondary, tertiary (and so on) abrasive features need not be evenly distributed among the abrasive elements 20. For example, in an abrasive article embodiment that includes five primary abrasive features and five abrasive elements, each of the five primary abrasive features may be disposed on a single abrasive element, or may be distributed among the 5 abrasive elements in any fashion.

In some embodiments, the primary abrasive features of the article may be present at an areal density of from 0.01 to 0.30/cm$^2$, from 0.04 to 1.30/cm$^2$, or from 0.8 to 23.0/cm$^2$; secondary abrasive features present at an areal density of from 0.2 to 33.0/cm$^2$, from 0.9 to 150.0/cm$^2$, or from 17 to 2655/cm$^2$; or tertiary abrasive features present at an areal density of from 0.2 to 11.0/cm$^2$, from 0.9 to 50.0/cm$^2$, or from 17 to 885/cm$^2$. For purposes of the present application, "areal density" of a set of abrasive features refers to the number of whole abrasive features present per cumulative projected unit area of the abrasive elements of the abrasive article.

In some embodiments, the primary abrasive features of the article may have an average feature height ($H_{1avg}$) of between 20 and 300 microns, between 40 and 250 microns, or between 60 and 160 microns. In some embodiments, the secondary abrasive features of the article may have an average feature height ($H_{2avg}$) of between 5 and 250 microns, between 20 and 150 microns, or between 40 and 55 microns. In some embodiments, the tertiary abrasive features of the article may have an average feature height ($H_{3avg}$) of between 5 and 200 microns, between 10 and 100 microns, or between 30 and 45 microns.

In some embodiments, the secondary features of the article (if present) may serve as a "stop layer" for the primary abrasive features. That is, the secondary features may function to limit the penetration of the primary features into the polishing pad that is being conditioned by the article, and thereby the aggressiveness of the abrasive elements. In this regard, it was discovered that secondary features (if present) satisfying the following condition provide adequate "stop layer" performance: the cross sectional areas of the abrasive features of the second set of abrasive features (i) taken in a plane that is parallel to the first major surface of the bases, and (ii) at a position along the second set of abrasive features that is 50% or less of the $H_{2avg}$, cumulatively, is at least 5%, at least 10%, or at least 15% of the cumulative projected areas of the abrasive elements of the abrasive article.

In some embodiments, the abrasive features can have any shape or shapes. Examples of suitable shapes for the abrasive features includes cylinders, half spheres, cubes, rectangular prisms, triangular prisms, hexagonal prisms, triangular pyramids, 4, 5 and 6-sided pyramids, truncated pyramids, cones, truncated cones, and the like.

In some embodiments, the abrasive features (of an article or of an abrasive element) can have the same base size or varying base sizes. The abrasive features may be spaced on the base of the abrasive element in a regular array or irregular array, and may be spaced at the same distance or varying distances from one another. In some embodiments, the abrasive elements may have an abrasive feature density (including primary features, secondary features, tertiary features, and so on) of between 1 and 1000 features/mm$^2$ or between 10 and 300 features/mm$^2$ (based on the projected area of the abrasive elements).

In some embodiments, a portion (up to all) of the abrasive features may be formed as precisely shaped abrasive features. As used herein, a precisely shaped feature refers to a topographical feature (e.g., a projection, an asperity, or the like) having a molded shape that is the inverse shape of a corresponding mold cavity, said shape being retained after the topographical feature is removed from the mold. In some embodiments, the precisely shaped abrasive features may be formed via micro-replication. As used herein, "micro-replication" refers to a fabrication technique wherein precisely shaped topographical features are prepared by casting or molding a polymer (or polymer precursor that is later cured to form a polymer) in a production tool, e.g. a mold or embossing tool, wherein the production tool has a plurality of micron sized to millimeter sized topographical features. Upon removing the polymer from the production tool, a series of topographical features are present in the surface of the polymer. The topographical features of the polymer surface have the inverse shape as the features of the original production tool.

In some embodiments, the abrasive elements may include or be formed of a carbide ceramic or an oxide ceramic (such as alumina or zirconia). Suitable carbide ceramics include silicon carbide, boron carbide, zirconium carbide, titanium carbide, tungsten carbide, or combinations thereof. In some embodiments, the abrasive elements may include carbide ceramic in an amount of at least 80 wt. %, at least 90 wt. %, at least 95 wt. %, or at least 99 wt. %, based on the total weight of the abrasive element. In some embodiments, the abrasive elements may include silicon carbine in an amount of at least 80 wt. %, at least 90 wt. %, at least 95 wt. %, or at least 99 wt. %, based on the total weight of the abrasive element.

In some embodiments, the abrasive elements may have a porosity of less than 5%, less than 3%, or less than 1%. As used herein, porosity (expressed as a percentage) refers to the total volume of voids in a body divided the total volume of the body. In some embodiments, the abrasive elements also have a mean grain size of less than 20 microns, less than 10 microns, less than 5 microns, or less than 3 microns. This low porosity and grain size may be significant in achieving robust and durable replicated features, which in turn results in good life and low wear rates of the abrasive elements.

In some embodiments, the abrasive elements (including the abrasive element base and the abrasive features) may be monolithic abrasive elements. As used herein, "monolithic" refers to a single body or single piece having a uniform or substantially uniform composition throughout the body or the piece. Monolithic abrasive elements are in contrast to composite abrasive elements in that the monolithic elements have abrasive features and regions between abrasive features that are continuous and consist of the primary abrasive material without an intervening matrix, while composite abrasive elements include abrasive particles embedded in a matrix.

In some embodiments, the abrasive elements may further include one or more coatings that function to achieve additional wear resistance and durability, reduce the coefficient of friction, protect from corrosion, and change surface properties. Useful coatings include, for example, chemical vapor deposited (CVD) or physical vapor deposited (PVD) diamond, doped diamond, silicon carbide, cubic boron nitride (CBN), fluorochemical coatings, hydrophobic or hydrophilic coatings, surface modifying coatings, anticorrosion coatings, diamond like carbon (DLC), diamond like glass (DLG), tungsten carbide, silicon nitride, titanium nitride, particle coatings, polycrystalline diamond, microcrystalline diamond, nanocrystalline diamond and the like. In some embodiments, the coating may be a composite material, such as, for example, a composite of fine diamond particles and a vapor deposited diamond matrix. In one embodiment, these coatings are conformal, enabling the precise surface features to be seen under the coating surface. The coating can be deposited by any suitable method known in the art, including chemical or physical vapor deposition, spraying, dipping and roll coating.

In some embodiments, the abrasive elements may be coated with a non-oxide coating. When a CVD diamond coating is used, the use of the silicon carbide ceramic has the additional benefit in that there is a good match in the coefficient of thermal expansion between the silicon carbide and the CVD diamond film. Therefore, these diamond coated abrasives additionally have excellent diamond film adhesion and durability.

In some embodiments, referring again to FIG. 1A, the abrasive elements 20 may be positioned on the major surface 15A of the carrier plate 15 in any desired configuration. For example, as shown in FIG. 1A, the abrasive elements 20 may be positioned on the major surface 15A in a circular configuration. Alternatively, the abrasive elements 20 may be positioned on the major surface 15A in a non-circular, annular, or spiral pattern. The number of abrasive elements 20 on the carrier element 15 is not particularly limited. In some embodiments, abrasive elements 20 may be present on the carrier element 15A at an areal density of between 0.011 and 0.175/cm$^2$, between 0.022 and 0.110/cm$^2$, or between 0.055 and 0.110/cm$^2$ (based on the projected area of the major surface 15A). For purposes of the present application, an "areal density" of abrasive elements refers to the number of whole abrasive elements present per surface unit area of the reference area (e.g., major surface 15A of the carrier element 15)).

In some embodiments, the abrasive elements 20 may be coupled (directly or indirectly) to the carrier element via any conventional fastening mechanism. Suitable fastening mechanisms include, for example, a two-part epoxy, pressure sensitive adhesives, structural adhesives, hot melt adhesives, B-stageable adhesives, mechanical fasteners, and mechanical locking devices.

In some embodiments, a resilient element may be disposed between the abrasive elements 20 and the major surface 15A of the carrier element 15. Generally, the resilient elements may serve to provide flexibility in positioning of the height of one of the abrasive elements relative to the height of one or more of the abrasive elements. For example, during assembly of the abrasive articles 10, the resilient elements may elastically deform under compression and be locked into a compressed position through a fastening element, thereby fixing the height of the abrasive element relative to the height of one or more of the abrasive elements. In some embodiments, the resilient element can be segmented, continuous, discontinuous, or gimbaled. Examples of suitable resilient elements include, for example, mechanical spring-like devices, flexible washers, foams, polymers, or gels. The resilient element can also have a fastening character, such as foam with an adhesive backing.

In some embodiments, the abrasive features of the abrasive elements can be aligned to a reference plane. The reference plane may be the theoretical plane through the maxima of selected features of an abrasive element or an abrasive article. Feature maxima may also be referred to as feature tips or tips. The selected features are the set of working features having a maximum common height, $D_0$.

In some embodiments, an alignment process may be employed to reproducibly create a defined bearing area or presentation to the abrasive article. In some embodiments, the abrasive elements are aligned to a planar surface (e.g., an "alignment plate") in contact with the maxima of the abrasive features. The planar surface of the alignment plate preferably has a tolerance of at least about +/−2.5 microns per 4 inch in length (10.2 cm) or even lower, i.e. even more planar. A resilient element and a fastening element may be used in this assembly process in order to precisely align the abrasive elements relative to each other on the carrier element. In this case, the abrasive elements are aligned such that there is maximal feature tip coplanarity. The non-coplanarity is the average of the absolute values of the distance of a selected set of tips from the ideal reference plane through the set of tips. The non-coplanarity is expressed as a percentage relative to the height of the selected features, $D_0$.

The abrasive articles also have low or controlled warping or bowing of each abrasive element from processing or thermal mismatch with coated materials, resulting in good element planarity. "Element planarity" refers to the planarity of selected feature tips within a precisely structured abrasive element relative to a reference plane. For a single abrasive element, the planarity refers to the variability of the distance of a set of feature tips relative to a reference plane. The set of tips used to calculate planarity includes tips from all features having a common maximum design height, $D_0$. A reference plane is defined as the plane having the best linear regression fit of all of the selected feature tips of height $D_0$. The non-planarity is the average of the absolute value of the distance of the selected tips from the reference plane. The planarity can be measured by carbon paper imprint test or standard topology tools, including laser profilometry, confocal imaging, and confocal scanning microscopy, combined with image analysis software, e.g., MOUNTAINSMAP V5.0 image analysis software (Digital Surf, Besancon, France). Element topology can also be characterized by skew, kurtosis, etc. In some embodiments, the abrasive elements of the present disclosure may have non-planarity of less than 20%, less than 10%, less than 5%, or less than 2% of the feature height.

In some embodiments, the abrasive articles may also have accurate alignment of the precisely shaped abrasive elements such that there is substantial coplanarity. For multiple abrasive elements, the coplanarity refers to the variability of the distance of a set of feature tips from a plurality of elements relative to a reference plane. This reference plane is defined as the plane having the best linear regression fit of all of the selected feature tips of maximum height $D_0$. The non-coplanarity is the average of the absolute values of the distance of selected tips from the reference plane. Non-coplanarity results when the separate abrasive elements are not aligned. Non-coplanarity can be seen through uneven pressure distribution, for example through a carbon imprint test. For multiple abrasive elements with even distribution on a carbon imprint test, the degree of coplanarity can be further quantified through standard topology tools, including laser profilometry, confocal imaging, and confocal scanning microscopy. Image software (e.g., MOUNTAINSMAP) can be used to combine multiple topographic maps into a composite topographic map for analysis. In some embodiments, a collective group of abrasive features on all of the abrasive elements of an abrasive article, having a common maximum design feature height of Do, may have a non-coplanarity of less than 20%, less than 10%, less than 5%, or less than 2% of the feature height.

In some embodiments, the abrasive elements of the present disclosure can be formed through machining, micromachining, microreplication, molding, extruding, injection molding, ceramic pressing, or the like, such that abrasive features are fabricated and are reproducible from part to part and within a part, reflecting the ability to replicate a design. In some embodiments, a ceramic die pressing process (e.g., a ceramic dry pressing) may be employed.

In some embodiments, the abrasive element may be fabricated from a molded green body. In such cases, the abrasive element is considered a molded abrasive element. When the abrasive element is molded, it is a subset of the precisely structured abrasive element where the structure is conferred by a molding process. For example, the shape may be the inverse of the mold cavity such that the shape is retained after the abrasive element green body has been removed from the mold. Various ceramic shaping processes may be used, including but not limited to: injection molding, slip casting, die pressing, hot pressing, embossing, transfer molding, gel casting and the like. In some embodiments, the die pressing process is used at room temperature, followed by sintering. Typically, ceramic die pressing near room temperature is referred to as ceramic dry pressing. Ceramic dry pressing typically differs from ceramic injection molding in that it is done at lower temperature, a much smaller amount of binder is used, die pressing is used, and the materials suitable for use as binder are not necessarily limited to thermoplastics.

In some embodiments, the abrasive elements may be fabricated without the use of carbide formers and are substantially free of oxide sintering aides. In some embodiments, the abrasive elements may include less than about 1% oxide sintering aides. The abrasive elements may also be substantially free of silicon and in particular include less than about 1% elemental silicon.

In some embodiments, the molded ceramic green body can be sintered to achieve high density, rigidity, fracture toughness and good feature fidelity. The green body is the unsintered, compacted ceramic element, as would be normally referred to by those skilled in the art.

In some embodiments, the green body includes a plurality of inorganic particles and a binder, where the plurality of inorganic particles is at least about 99% carbide ceramic by weight. In one embodiment, the inorganic particles are ceramic particles and can be silicon carbide, boron carbide, zirconium carbide, tungsten carbide or combinations thereof.

In some embodiments, the binder of the green body can be a thermoplastic binder. Examples of suitable binders include, but are not limited to, thermoplastic polymers. In one embodiment, the binder is a thermoplastic binder with a $T_g$ of less than about 25° C. and particularly less than about 0° C. In one embodiment, the binder is a polyacrylate binder.

In some embodiments, the green body may also include a carbon source. Suitable carbon sources include, for example, phenolic resin, cellulose compounds, sugars, graphite, carbon black, and combinations thereof. In some embodiments, the green body may include between 0.5% to 10% by weight of a carbon source and particularly between 2% and 7% by weight of a carbon source. The carbon compounds in the green body composition result in lower porosities after sintering. The green body can also include additional functional materials, such as a release agent or a lubricant. In one embodiment the green body contains between 0.5% to 10% by weight of a lubricant.

In some embodiments, the green body is an abrasive element precursor and may be made by first mixing a plurality of inorganic particles, a binder, and a carbon source to form a mixture. In one embodiment, the agglomerates of the mixture are formed by a spray drying process.

In some embodiments, a mold having a plurality of precisely shaped cavities is placed in the die cavity such that a majority of the precisely shaped cavities of the mold are filled with the mixture. The mold may be formed of metal, ceramic, cermet, composite or a polymeric material. In one embodiment, the mold is a polymeric material such as polypropylene. In another embodiment, the mold is nickel. Pressure is then applied to the mixture to compact the mixture into the precisely shaped cavities to form a green body ceramic element having first and second major surfaces. The pressure may be applied at ambient temperature or at an elevated temperature. More than one pressing step may also be used.

In some embodiments, the mold, or production tool, has a predetermined array of at least one specified shape on the surface thereof, which is the inverse of the predetermined array and specified shape(s) of the abrasive features of the abrasive elements.

In addition to the above technique, in some embodiments, a mold can be formed by preparing a positive master, which has a predetermined array and specified shapes of the abrasive features of the abrasive elements. The mold is then made having a surface topography being the inverse of the positive master. A positive master may be made by direct machining techniques such as diamond turning, disclosed in U.S. Pat. No. 5,152,917 (Pieper, et al.) and U.S. Pat. No. 6,076,248 (Hoopman, et al.), the disclosures of which are herein incorporated by reference. These techniques are further described in U.S. Pat. No. 6,021,559 (Smith), the disclosure of which is herein incorporated by reference.

A mold including, for example, a thermoplastic, can be made by replication off the metal master tool. A thermoplastic sheet material can be heated, optionally along with the metal master, such that the thermoplastic material is embossed with the surface pattern presented by the metal master by pressing the two surfaces together. The thermoplastic can also be extruded or cast onto to the metal master and then pressed. Other suitable methods of production tooling and metal masters are discussed in U.S. Pat. No. 5,435,816 (Spurgeon et al.), which is herein incorporated by reference.

In some embodiments, to form an abrasive element, the green body ceramic element is removed from the mold and heated to cause sintering of the inorganic particles. In some embodiments, the green body ceramic element is heated during a binder and carbon source pyrolization step in an oxygen poor atmosphere in a temperature range of between about 300 and about 900° C. In some embodiments, the green body ceramic element is sintered in an oxygen-poor atmosphere at between about 1900 and about 2300° C. to form the abrasive element. In some embodiments, the abrasive elements may then be cleaned, followed by, optionally depositing any of the above-described coatings onto the abrasive elements.

In some embodiments, the abrasive articles of the present disclosure (which may also be referred to as polishing pad conditioners or pad conditioners) may be used in conventional chemical mechanical planarization (CMP) processes. Various materials may be polished or planarized in such conventional CMP processes, including, but not limited to: copper, copper alloys, aluminum, tantalum, tantalum nitride, tungsten, titanium, titanium nitride, nickel, nickel-iron alloys, nickel-silicide, germanium, silicon, silicon nitride, silicon carbide, silicon-dioxide, oxides of silicon, hafnium oxide, materials having a low dielectric constant, and combinations thereof. In some embodiments, the polishing pads (or at least the working surface of the polishing pads) conditioned by the abrasive articles of the present disclosure may include thermoplastics, thermoplastic elastomers (TPEs), e.g. TPEs based on block copolymers, or thermosets, e.g. elastomers and combinations thereof. In some embodiments, the polishing pads (or at least the working surface of the polishing pads) may include or be formed of a polyurethane, polyamide, polybutadiene, or polyolefin, such as is common in commercially available polishing pads for substrate planarization. In some embodiments, the hardness of the working surface of the polishing pads may be greater than about 20 Shore D, greater than about 30 Shore D, or greater than about 40 Shore D; less than about 90 Shore D, less than about 80 Shore D, or less than about 70 Shore D; between 20 and 90 Shore D, between 30 and 80 Shore D, or between 40 and 70 Shore D. In some embodiments, the hardness of the working surface of the polishing pads may be greater than about 20 Shore A, greater than about 30 Shore A, or greater than about 40 Shore A; less than about 95 Shore A, less than about 80 Shore A or less than about 70 Shore A; or between 20 and 95 Shore A, between 30 and 80 Shore A, or between 40 and 70 Shore A.

In some embodiments, the pad conditioners may be configured to mount onto conventional CMP tools and run under conventional operating conditions. In some embodiments, the CMP process may be run at a range of rotational speeds between about 20 RPM and about 150 RPM, at a range of applied load of between about 1 lb and about 90 lbs, and sweeping back and forth across the polishing pad at a rate of between about 1 and about 25 sweeps per minute, utilizing conventional sweep profiles, such as sinusoidal sweeps or linear sweeps.

Listing of Embodiments

1. An abrasive article comprising:
a plurality of abrasive features disposed on one or more abrasive elements, each of the one or more abrasive elements comprising a base having a first major surface from which the plurality of abrasive features extend;
wherein a first set of the plurality of abrasive features (i) has an average height, $H_{1avg}$, (ii) has a standard deviation of less than 10% of $H_{1avg}$, and (iii) comprises between 5 and 130 abrasive features.

2. The abrasive article of embodiment 1, wherein a second set of the plurality of abrasive features has (i) an average height, $H_{2avg}$, and (ii) a standard deviation of less than 10% of $H_{2avg}$, wherein $H_{1avg}$ is at least 5 microns greater than $H_{2avg}$.

3. The abrasive article of embodiment 2, wherein the second set of the plurality of abrasive features comprises at least 100 abrasive features.

4. The abrasive article of any one of embodiments 2-3, wherein the cross sectional areas of each of the features of the second set of abrasive features (i) taken in a plane that is parallel to the first major surface of the bases, and (ii) at a position along the second set of abrasive features that is 50% or less of the $H_{2avg}$, cumulatively, is at least 5% of the cumulative projected areas of the of the one or more abrasive elements.

5. The abrasive article of any one of the previous embodiments, the features of the first set of abrasive features and their respective abrasive element bases, as a collective, are monolithic.

6. The abrasive article of any one of the previous embodiments, wherein the first set of abrasive features are precisely shaped features.

7. The abrasive article of any one of the previous embodiments, wherein the areal density of the first set of abrasive features is between 0.01 to 0.30/cm².

8. The abrasive article of any one of embodiments 2-7, wherein the areal density of the second set of abrasive features is between 0.2 to 33.0/cm².

9. The abrasive article of any one of the previous embodiments, wherein the abrasive elements comprise a carbide ceramic.

10 The abrasive article of embodiment 9, wherein carbide ceramic is silicon carbide, boron carbide, zirconium carbide, titanium carbide, tungsten carbide or combinations thereof.

11. The abrasive article of any one of the previous embodiments, wherein the abrasive elements are at least 99% by weight silicon carbide, based on the total weight of the base and the abrasive features.

12. The abrasive article of any one of the previous embodiments, wherein the porosity of the abrasive elements is less than about 3%.

13. The abrasive article of any one of the previous embodiments, further comprising a chemical vapor deposited or physical vapor deposited coating disposed on the abrasive features.

14. The abrasive article of any one of the previous embodiments, further comprising a carrier plate having a first major surface; wherein the one or more abrasive elements are coupled to the first major surface of the carrier plate.

15. A method of conditioning a polishing pad, the method comprising:
performing a CMP operation using a polishing pad;
contacting a working surface of the polishing pad with a working surface of the abrasive article of any one of embodiments 1-14.

EXAMPLES

The present disclosure is more particularly described in the following examples that are intended as illustrations only, since numerous modifications and variations within the scope of the present disclosure will be apparent to those skilled in the art. Unless otherwise noted, all parts, percentages, and ratios reported in the following example are on a weight basis.

Test Methods
Feature Height Measurement Test Method
Feature height of the precisely shaped abrasive features on each abrasive element was measured using a Bruker Contour GT 3D optical profiler, combined with MOUNTAINSMAP Universal V6.1 image analysis software (Digital Surf, Besancon, France). The optical profiler magnification (5××0.55×) and scan speed settings (5×) were adjusted to provide sufficient resolution to accurately locate the feature tips and measure accurately the height of each. For an abrasive element, a group of features, all having the same maximum design feature height of Do, was selected, and each of their peak heights measured relative to the saddle point of their local course lines. The peak height, course line, and saddle point are defined by MOUNTAINSMAP Universal V6.1 watershed algorithm.

Benchtop Tribometer CMP Pad Wear Rate and Pad Surface Roughness Test Methods
Pad wear rates and pad surface roughness measurements were conducted on pads conditioned with abrasive articles (described below) using a CP4 Micro Tribometer benchtop tribology polishing tool available from Center for Tribology, Inc. (now available through Bruker corporation) in conjunction with the 3D optical profiler and software analysis tools described previously in the Feature Height Measurement Test Method. Two different CMP pad types were used in order to amplify either the pad wear rate or the pad surface finish. All of the abrasive article examples and comparative examples were run on a relatively hard, but easily conditioned pad in order to amplify the pad wear rate results. The pads were available under the trade designation 9006FPJ part number CMP9006FPJ from JSR Micro, Inc, Sunnyvale, CA A second industry standard hard pad was used to gather surface roughness values for Examples 1, 2, 4, 6, and 8 and Comparative Examples A-G. These pads were available under the trade designation Dow IC1010 material number 10261135 from The Dow Chemical Company, Midland MI The as received pads were die cut to a 9 inch (23 cm) diameter and mounted to the platen of the CP4. An abrasive article, e.g. an Example or Comparative Example of the present disclosure, was mounted to the spindle of the CP4 using the universal 3 screw mounting configuration for pad conditioners. The spindle was moved downward (upward and downward motion considered to be in the z-direction) such that the abrasive article made contact with the pad and was maintained at a downforce of 6 lbs (6.7 kg) while the conditioner spindle was rotated at a speed of 29 rpm and the pad spindle was rotated at a speed of 61 rpm for the duration of the test. The conditioner spindle would sweep from 55 mm to 69 mm and back at a rate of 10 cycles per minute. A typical test lasted 30 minutes with the first five minutes considered a break-in period. The tribometer tracked the vertical position of the mounted abrasive article as a function of time. The change in the height of the abrasive article over the time period of the test yields the pad wear rate. The slope of the best fit line of the z-height position over time, excluding the first 5 minutes of the test (break-in period), was defined as the individual pad wear rate. Each abrasive article was measured at least three times and not more than 6 times and the Pad wear rate was reported as the average of the individual test results. After the pad wear rate test had concluded, the 9 inch (23 cm) diameter platen was removed from the tribometer. 3D optical profiler scans were conducted over a 2 mm by 4 mm region of the conditioned pad at locations 0.5 inch (1.3 cm), 2.25 (5.7 cm) inch, and 3.0 inch (7.6 cm) distances from the pad center. MOUNTAINS-MAP software was used to obtain the mean surface roughness (Ra) at these different pad locations and the average roughness value of the three locations was reported as the surface roughness.

CMP Tool Pad Wear Rate and Pad Surface Roughness Test Methods

Measurements were conducted on pads conditioned on an Applied Materials 200 mm REFLEXION polishing tool. The conditioning cycle was run at 6 lbs (2.7 kg) of downforce with the conditioner speed of 87 rpm and a pad speed of 93 rpm. The conditioner arm sweep recipe had a start position of 1.00 inch (2.5 cm) and an end position of 12.75 inch (32.4 cm). The sweep was divided into 13 zones which had the following relative dwell times respectively: 1.20, 1.10, 1.00, 1.00, 1.00, 1.00, 1.00, 1.00, 1.00, 1.00, 1.00, 1.20 and 1.55. The cycle time was 13 sweeps per minute. The pad wear rate was determined by using a laser profilometer to measure the depth of every groove on the initial pad surface between 3 inches (7.6 cm) and 14 inches (35.6 cm) from the center of the pad. The initial pad grove depth was defined as the average value of the depths of all of the grooves lying between the 3 (7.6 cm) inch and 14 inch (35.6 cm) distances. The initial average pad groove depth was compared to the average groove depth of the pad across the same length, after the pad had been abraded for one hour. The difference in average groove depth divided by the test time was reported as the pad wear rate. To determine the surface roughness of the pad, a contact profilometer was used to measure the Ra at 2 inch (5.1 cm), 4 inch (10.2 cm), 6 inch (15.2 cm), 8 inch (20.3 cm), 10 inch (25.4 (cm), 12 inch (30.5 cm) and 14 inch (35.6 cm) distances from center of the recently conditioned pad. The Ra was reported as the average of these 7 locations.

Examples and Comparative Examples (CEs)

Twenty-four abrasive element designs were prepared as described in U.S. Pat. No. 9,956,664 Example 10, differing only in abrasive feature geometries as described Table 1. U.S. Pat. No. 9,956,664 is incorporated in its entirety herein by reference. Each abrasive element had precisely shaped features having at least one primary feature height, which was higher and offset to either a secondary level of features or a flat base region between the features. Five abrasive elements were prepared for each Example and Comparative Example and assembled into an abrasive article. The assembly process was developed such that the tallest, precisely shaped features on each element, all having the same design feature height, would become planar. A planar sapphire surface was used as an alignment plate. The segments were placed onto the alignment plate such that the major surfaces having precisely shaped features were in direct contact with the alignment plate (facing down) with their second flat, major surfaces facing upwards. The abrasive elements were arranged in a circular pattern, such that their center points were positioned along the circumference of a circle with a radius of about 1.75 inch (44.5 mm) and spaced apart equally at about 72° around the circumference. A fastening element was then applied to the exposed surface of the abrasive elements in the center region. The fastening element was an epoxy adhesive available under the trade designation 3M SCOTCH-WELD EPOXY ADHESIVE DP420 from 3M Company, St. Paul, Minnesota A circular, stainless steel carrier, having a diameter of 4.25 inch (108 mm) and a thickness of 0.22 inch (5.64 mm) was then placed face down on top of the fastening element (the back side of the carrier is machined, such that, it may be attached to the carrier arm of a REFLEXION polisher). A 10 lb (4.54 kg) load was applied uniformly across the carrier's exposed surface and the adhesive was allowed to cure for about 4 hours at room temperature. In some cases if there was only 1 or 2 primary abrasive features on the abrasive elements, small holes were put into the sapphire alignment plate specifically located to allow the primary abrasive features to have no contact with the sapphire surface and secondary abrasive features to contact the sapphire surface in order to maintain a planarity among the different element abrasive surfaces. The offset height between the primary and secondary abrasive features is defined as the height difference between the primary feature and secondary feature or, if no secondary features are present, the height difference between the primary feature and base region. The aspect ratio is defined as the feature height divided by its base width. The truncation depth of the primary feature is defined by the depth from which the theoretical peak would have been formed if the sides of the pyramid would have been allowed to converge to a point. The primary feature height was measured as described in the Feature Height Measurement Test Method. The number of primary features is the number of primary features found on the fully constructed abrasive article (including all 5 elements). The areal density of the features is defined as the number of primary features per element divided by the area of the surface of the abrasive article. The surface of the abrasive article is defined as the total working surface of the one or more abrasive elements of the abrasive article or the surface area of the first major surface of a carrier plate the abrasive elements may be attached thereto, whichever is larger. Comparative Examples 1, 2 and 4 through 7 are all hexagonal base pyramids. Comparative Examples 3, 8, 9 and Examples 1-15 are all rectangular or square base pyramids. The pyramids were arranged in a rectangular grid pattern, see FIGS. 3A and 3B, for example.

TABLE 1

Precisely Shaped Feature Parameters of Examples and Comparative Examples.

| Example or CE | Number of Primary Features | Areal Density of Primary Features (Features/cm$^2$) | Primary Feature Height (microns) | Offset Height (microns) | Truncation Depth of Primary Features (microns) | Aspect Ratio |
|---|---|---|---|---|---|---|
| CE-A | 540 | 5.90 | 150 | 50 | 0 | 0.50 |
| CE-B | 960 | 10.49 | 150 | 150 | 0 | 0.67 |
| CE-C | 4720 | 51.60 | 150 | 10 | 0 | 0.50 |
| CE-D | 510 | 5.58 | 160 | 160 | 0 | 0.67 |
| CE-E | 300 | 3.28 | 160 | 160 | 0 | 0.67 |
| CE-F | 135 | 1.48 | 160 | 160 | 0 | 0.67 |
| CE-G | 635 | 6.94 | 150 | 50 | 0 | 0.67 |
| CE-H | 2 | 0.02 | 120 | 75 | 10 | 0.50 |
| CE-I | 3 | 0.03 | 120 | 75 | 10 | 0.50 |
| Example 1 | 5 | 0.05 | 145 | 100 | 20 | 0.50 |
| Example 2 | 5 | 0.05 | 145 | 100 | 20 | 0.67 |
| Example 3 | 5 | 0.05 | 120 | 75 | 10 | 0.50 |
| Example 4 | 5 | 0.05 | 95 | 50 | 40 | 0.50 |
| Example 5 | 10 | 0.11 | 145 | 100 | 20 | 0.50 |
| Example 6 | 20 | 0.22 | 145 | 100 | 20 | 0.50 |
| Example 7 | 25 | 0.27 | 145 | 100 | 20 | 0.50 |
| Example 8 | 20 | 0.22 | 145 | 100 | 20 | 0.67 |
| Example 9 | 10 | 0.11 | 120 | 75 | 10 | 0.50 |
| Example 10 | 20 | 0.22 | 120 | 75 | 10 | 0.50 |
| Example 11 | 25 | 0.27 | 120 | 75 | 10 | 0.50 |
| Example 12 | 20 | 0.22 | 120 | 75 | 10 | 0.67 |
| Example 13 | 20 | 0.22 | 85 | 40 | 20 | 0.50 |
| Example 14 | 25 | 0.27 | 85 | 40 | 20 | 0.50 |
| Example 15 | 20 | 0.22 | 120 | 120 | 10 | 0.50 |

Figure 4:
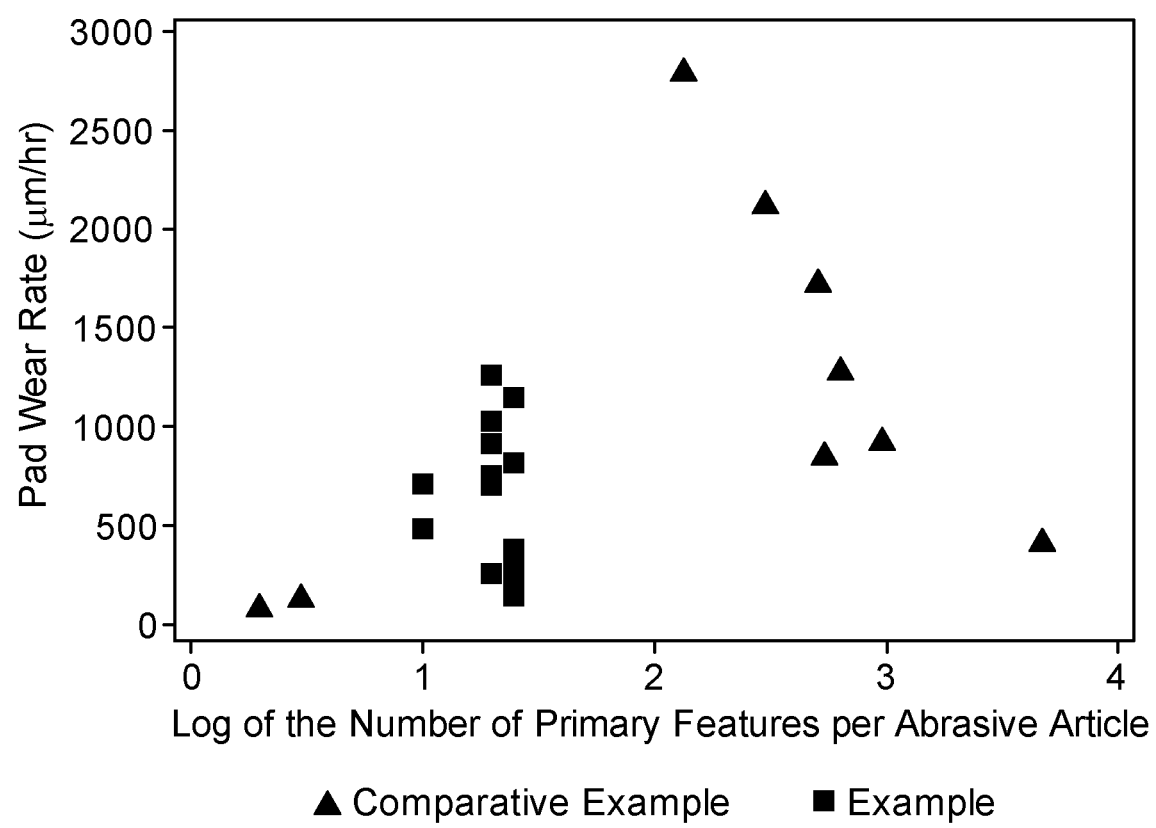
FIG. 4 is a scatterplot of the average CP4 pad wear rate vs. the Logic) of the number of primary abrasive features.

Using Benchtop Tribometer CMP Pad Wear Rate and Pad Surface Roughness Test Methods, the pad wear rate and pad surface roughness was determined for Examples 1-15 and Comparative Examples 1-9, Table 2. The results showed that as the number of abrasive features on an element or the areal density decreased, the pad wear rate of the abrasive article increased along with it surface roughness (see FIG. 4). This is a well-known and documented relationship in the abrasives industry. However, as the number of tips per abrasive article and areal density decreased into the ultra-low areal density region (below 26 features/element or 0.24 features/mm$^2$), this relationship reversed, and the pad wear rate began to decrease. Also, at this point, the surface roughness was no longer correlated to the feature count and areal density of the primary features and was now correlated to the offset height between the primary and secondary features.

TABLE 2

Pad Wear Rate and Surface Finish Results

| Example or CE | Pad Wear Rate (microns/hr) | Surface Finish Ra (microns) |
|---|---|---|
| CE-A | 850 | 5.303 |
| CE-B | 924 | 4.802 |
| CE-C | 410 | 2.613 |
| CE-D | 1722 | 5.764 |
| CE-E | 2125 | 6.023 |
| CE-F | 2797 | 6.582 |
| CE-G | 1281 | 5.111 |
| CE-H | 80 | — |
| CE-I | 124 | — |
| Example 1 | 318 | 13.807 |
| Example 2 | 383 | 16.762 |
| Example 3 | 217 | — |
| Example 4 | 140 | 9.411 |
| Example 5 | 711 | — |
| Example 6 | 1030 | 13.189 |
| Example 7 | 1148 | — |

TABLE 2-continued

Pad Wear Rate and Surface Finish Results

| Example or CE | Pad Wear Rate (microns/hr) | Surface Finish Ra (microns) |
|---|---|---|
| Example 8 | 1265 | 15.360 |
| Example 9 | 484 | — |
| Example 10 | 700 | — |
| Example 11 | 813 | — |
| Example 12 | 753 | — |
| Example 13 | 259 | — |
| Example 14 | 327 | — |
| Example 15 | 912 | — |

CMP Tool Tests Using Examples

Using the CMP Tool Pad Wear Rate and Pad Surface Roughness Test Methods, the pad wear rate and pad surface roughness, on the industry standard hard pad (Dow IC1010), were determined for the Examples and Comparative Examples indicated in Table 3. The results are shown in Table 3. This data gives similar results to the benchtop tribometer data.

TABLE 3

Pad Wear Rate and Surface Finish Results.

| Example or CE | Pad Wear Rate (μm/hr) | Surface Finish Ra (μm) |
|---|---|---|
| CE-A | 41 | 3.842 |
| CE-B | 48 | 4.354 |
| CE-C | 16 | 3.141 |
| CE-E | 69 | 4.918 |
| CE-F | 154 | 5.969 |
| CE-G | 70 | 4.117 |
| CE-I | 1 | 6.984 |
| Example 5 | 12 | 7.387 |
| Example 6 | 20 | 7.706 |
| Example 7 | 27 | 8.148 |

TABLE 3-continued

Pad Wear Rate and Surface Finish Results.

| Example or CE | Pad Wear Rate (μm/hr) | Surface Finish Ra (μm) |
|---|---|---|
| Example 8 | 69 | 8.000 |
| Example 11 | 10 | 7.185 |
| Example 12 | 63 | 7.398 |
| Example 13 | 26 | 5.181 |
| Example 14 | 11 | 5.395 |
| Example 15 | 59 | 7.784 |

What is claimed is:

1. An abrasive article comprising:
a plurality of abrasive features disposed on one or more abrasive elements, each of the one or more abrasive elements comprising a base having a first major surface from which the plurality of abrasive features extend;
wherein a first set of the plurality of abrasive features (i) has an average height, $H_{1avg}$, (ii) has a standard deviation of less than 10% of $H_{1avg}$, and (iii) comprises between 5 and 130 abrasive features;
wherein a second set of the plurality of abrasive features has (i) an average height, $H_{2avg}$, and (ii) a standard deviation of less than 10% of $H_{2avg}$, wherein $H_{1ave}$ is at least 5 microns greater than $H_{2avg}$;
wherein cross sectional areas of each of the plurality of features of the second set of plurality of abrasive features (i) taken in a plane that is parallel to the first major surface of the bases, and (ii) at a position along the second set of abrasive features that is 50% or less of the $H_{2avg}$, cumulatively, is at least 5% of the cumulative projected areas of the of the one or more abrasive elements.

2. The abrasive article of claim 1, wherein the second set of the plurality of abrasive features comprises at least 100 abrasive features.

3. The abrasive article of claim 1, the plurality of abrasive features of the first set of plurality of abrasive features and their respective abrasive element bases, as a collective, are monolithic.

4. The abrasive article of claim 1, wherein the first set of plurality of abrasive features are precisely shaped features.

5. The abrasive article of claim 1, wherein an areal density of the first set of plurality of abrasive features is between 0.01 to 0.30/cm$^2$.

6. The abrasive article of claim 1, wherein an areal density of the second set of plurality of abrasive features is between 0.2 to 33.0/cm$^2$.

7. The abrasive article of claim 1, wherein the one or more abrasive elements comprise a carbide ceramic.

8. The abrasive article of claim 7, wherein carbide ceramic is silicon carbide, boron carbide, zirconium carbide, titanium carbide, tungsten carbide or combinations thereof.

9. The abrasive article of claim 1, wherein the one or more abrasive elements are at least 99% by weight silicon carbide, based on the total weight of the base and the plurality of abrasive features.

10. The abrasive article of claim 1, wherein a porosity of the abrasive elements is less than 3%.

11. The abrasive article of claim 1, further comprising a chemical vapor deposited or physical vapor deposited coating disposed on the plurality of abrasive features.

12. The abrasive article of claim 1, further comprising a carrier plate having a first major surface; wherein the one or more abrasive elements are coupled to the first major surface of the carrier plate.

13. A method of conditioning a polishing pad, the method comprising:
performing a CMP operation using a polishing pad; and
contacting a working surface of the polishing pad with a working surface of the abrasive article of claim 1.

* * * * *